United States Patent
Yang et al.

(10) Patent No.: US 9,910,623 B2
(45) Date of Patent: Mar. 6, 2018

(54) TRAINING OF STORAGE DEVICES IN COMPUTING SYSTEMS AND ENVIRONMENTS

(71) Applicant: TERADATA US, INC., Dayton, OH (US)

(72) Inventors: Liuxi Yang, Sunnyvale, CA (US); Jeremy L. Branscome, Santa Clara, CA (US)

(73) Assignee: Teradata US, Inc., Dayton, OH (US)

( * ) Notice: Subject to any disclaimer, the term of this patent is extended or adjusted under 35 U.S.C. 154(b) by 544 days.

(21) Appl. No.: 14/215,405

(22) Filed: Mar. 17, 2014

(65) Prior Publication Data

US 2014/0279759 A1      Sep. 18, 2014

Related U.S. Application Data

(63) Continuation-in-part of application No. 13/970,721, filed on Aug. 20, 2013, now Pat. No. 9,208,829.

(60) Provisional application No. 61/787,726, filed on Mar. 15, 2013, provisional application No. 61/788,086, filed on Mar. 15, 2013.

(51) Int. Cl.
| | |
|---|---|
| G06F 15/18 | (2006.01) |
| G06F 3/06 | (2006.01) |
| G06F 13/16 | (2006.01) |
| G11C 29/02 | (2006.01) |
| G11C 5/04 | (2006.01) |
| G11C 11/401 | (2006.01) |

(52) U.S. Cl.
CPC ........ *G06F 3/0671* (2013.01); *G06F 13/1689* (2013.01); *G11C 29/022* (2013.01); *G11C 29/028* (2013.01); *G11C 5/04* (2013.01); *G11C 11/401* (2013.01); *G11C 2207/2254* (2013.01)

(58) Field of Classification Search
CPC  G06N 5/04; G06N 7/005; G06N 5/02; G06Q 50/01
USPC ........................................... 706/12
See application file for complete search history.

(56) References Cited

U.S. PATENT DOCUMENTS

| | | | |
|---|---|---|---|
| 7,539,929 B1 * | 5/2009 | Stern | H03M 13/13 714/701 |
| 7,908,259 B2 * | 3/2011 | Branscome | G06F 17/30442 707/705 |
| 7,966,343 B2 * | 6/2011 | Yang | G06F 17/30315 707/791 |

(Continued)

OTHER PUBLICATIONS

Enhancing Cache Coherent Architectures with access patterns for embedded manycore systems Jussara Marandola; Stephane Louise; Loï c Cudennec; Jean-Thomas Acquaviva; David A. Bader 2012 International Symposium on System on Chip (SoC) Year: 2012 pp. 1-7 IEEE Conference Publications.*

(Continued)

*Primary Examiner* — Michael B Holmes
(74) *Attorney, Agent, or Firm* — Ramin Mahboubian

(57) ABSTRACT

Storage devices and components, including memory components (e.g., non-volatile memory) can be trained by executable code that facilitates and/or performs reads and/or write requests to one or more storage sub-modules of a storage component (e.g., memory configured on a memory channel) made up of multiple storage components (e.g., DIMMs). The executable code can also train multiple storage components at the same time and/or in parallel.

16 Claims, 5 Drawing Sheets

(56) References Cited

U.S. PATENT DOCUMENTS

| | | | | |
|---|---|---|---|---|
| 8,224,800 | B2* | 7/2012 | Branscome | G06F 17/30442 707/705 |
| 8,229,918 | B2* | 7/2012 | Branscome | G06F 17/30442 707/713 |
| 8,234,267 | B2* | 7/2012 | Branscome | G06F 17/30442 707/712 |
| 8,244,718 | B2* | 8/2012 | Chamdani | G06F 17/30442 707/718 |
| 8,468,151 | B2* | 6/2013 | Branscome | G06F 17/30519 707/716 |
| 8,862,625 | B2* | 10/2014 | Meiyyappan | G06F 17/30492 707/791 |
| 9,141,670 | B2* | 9/2015 | Branscome | G06F 17/30519 |
| 9,378,231 | B2* | 6/2016 | Yang | G06F 17/30315 |
| 9,542,442 | B2* | 1/2017 | Meiyyappan | G06F 17/30492 |
| 9,553,605 | B2* | 1/2017 | Branscome | H03M 7/30 |
| 2011/0022886 | A1* | 1/2011 | Yang | G11C 11/5642 714/719 |
| 2012/0144133 | A1* | 6/2012 | Walter | G06F 19/322 711/154 |
| 2014/0043042 | A1* | 2/2014 | Billau | G06F 21/606 324/612 |
| 2014/0181385 | A1* | 6/2014 | Cudak | G11C 7/1072 711/105 |

OTHER PUBLICATIONS

RAID5 performance with distributed sparing A. Thomasian; Jai Menon IEEE Transactions on Parallel and Distributed Systems Year: 1997, vol. 8, Issue: 6 pp. 640-657 IEEE Journals & Magazines.*

Debugging Distributed-Shared-Memory Communication at Multiple Granularities in Networks on Chip Bart Vermeulen; Kees Goossens; Siddharth Umrani Second ACM/IEEE International Symposium on Networks-on-Chip (nocs 2008) Year: 2008 pp. 3-12 IEEE Conference Publications.*

The Improved Correlation Matrix Memory (CMML) Nimish Shah; Simon O'Keefe; Jim Austin 2007 International Joint Conference on Neural Networks Year: 2007 pp. 1168-1173 IEEE Conference Publications.*

* cited by examiner

TRAINING OF STORAGE DEVICES IN COMPUTING SYSTEMS AND ENVIRONMENTS

CROSS-REFERENCE TO RELATED PATENT APPLICATIONS

This application takes priority from the Provisional U.S. Patent Application No. 61/787,726, entitled: "OPTIMAL MULTI-RANK, MULTI-DIMM INTERFACE TRAINING," filed on Mar. 15, 2013, which is hereby incorporated by reference herein.

This application takes priority from the Provisional U.S. Patent Application No. 61/788,086, entitled: "ERROR DETECTION AND RECOVERY ON A HIGH SPEED LINK," filed on Mar. 15, 2013, which is also hereby incorporated by reference herein.

This application is a Continuation-in-Part of U.S. patent application Ser. No. 13/970,721, entitled: ("DESIGNATED MEMORY SUB-CHANNELS FOR COMPUTING SYSTEMS AND ENVIRONMENTS," filed on Aug. 20, 2013, which is also hereby incorporated by reference herein.

BACKGROUND

Data can be an abstract term. In the context of computing environments and systems, data can generally include all forms of information storable in a computer readable medium (e.g., memory, hard disk). Data, and in particular, one or more instances of data can also be referred to as data object(s). As is generally known in the art, a data object can, for example, be an actual instance of data, a class, a type, or a particular form of data, and so on.

Generally, one important aspect of computing and computing systems is storage of data. Today, there is an ever increasing need to manage storage of data, especially, data stored in various forms of memory and memory devices in computing systems and environments.

As is widely known in the art, techniques for management of storage devices are very useful.

SUMMARY

Broadly speaking, the invention relates to computing environments and systems. More particularly, the invention relates to training storage devices in c computing environments and systems.

In accordance with one aspect, storage components (e.g., non-volatile memory components) can be trained by using executable code that facilitates and/or performs reads and/or write requests to one or more storage sub-modules of a storage component (e.g., memory configured on a memory channel) made up of multiple storage components (e.g., DIMMs). The executable code can also train multiple storage components at the same time and/or in parallel in accordance with another aspect.

Other aspects and advantages will become apparent from the following detailed description, taken in conjunction with the accompanying drawings, illustrating by way of example the principles of the invention.

BRIEF DESCRIPTION OF THE DRAWINGS

The present invention will be readily understood by the following detailed description in conjunction with the accompanying drawings, wherein like reference numerals designate like structural elements, and in which.

DETAILED DESCRIPTION

As noted in the background section, techniques for management of storage devices are very useful and can be an important aspect of computing systems and environments. These storage devices include various forms of memory and memory devices that are prevalent in various computing devices.

As those skilled in the art know, "training" of storage devices, including memory devices can be very useful in management of storage devices. Training of a storage device can also include activities for the purpose of establishing and then maintaining reliable communication with a storage device (e.g., training a communication interface for accessing a storage device). Today, memory devices have evolved to more and more complex forms where training them presents even more challenges.

Figure 1:
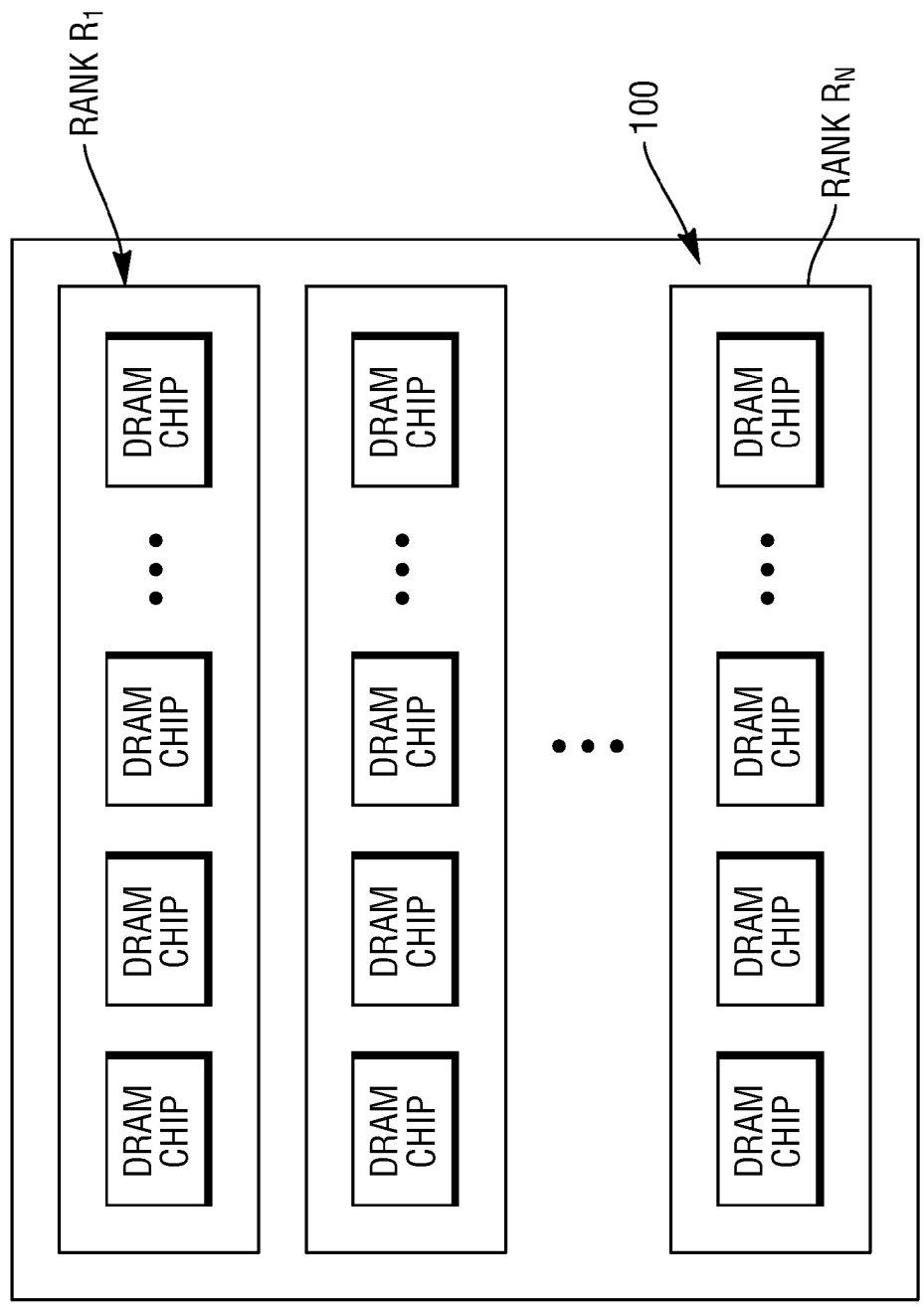
FIG. 1 depicts a memory component (e.g., a DIMM) comprised of multiple ranks R1-RN, wherein each rank can include multiple chips (e.g., DRAM chips) configured to be individually addressable.

To further elaborate, FIG. 1 depicts a memory component (e.g., a DIMM) 100 comprised of multiple ranks R1-RN, wherein each rank can include multiple chips (e.g., DRAM chips) configured to be individually addressable. As suggested by FIG. 1, a single memory component can have a very complex and deep structure Furthermore, there is a desire to effectively provide (or "pack") more and more memory components on memory "channels," as those skilled in the art know. In other words, there is desire to pack more and more memory capacity on a single interface. However, this desire is currently limited by the physics and the cost of training memory components, as conventionally, training is performed by using hardware (i.e., implementing the logic for performing in hardware).

Accordingly, improved techniques for training storage devices are needed.

As such, it will be appreciated that storage components (and/or devices), including non-volatile memory components, can be trained by using executable code, in accordance with one aspect. The executable code can facilitate and/or perform reads and/or write requests to one or more storage sub-modules of a storage component (e.g., memory configured on a memory channel of a computing device) made up of multiple storage components (e.g., DIMMs). The executable code can also train multiple storage components at the same time and/or in parallel in accordance with another aspect.

Embodiments of these aspects of the invention are also discussed below with reference to FIGS. 2-5. However, those skilled in the art will readily appreciate that the detailed description given herein with respect to these figures is for explanatory purposes as the invention extends beyond these limited embodiments.

Figure 2:
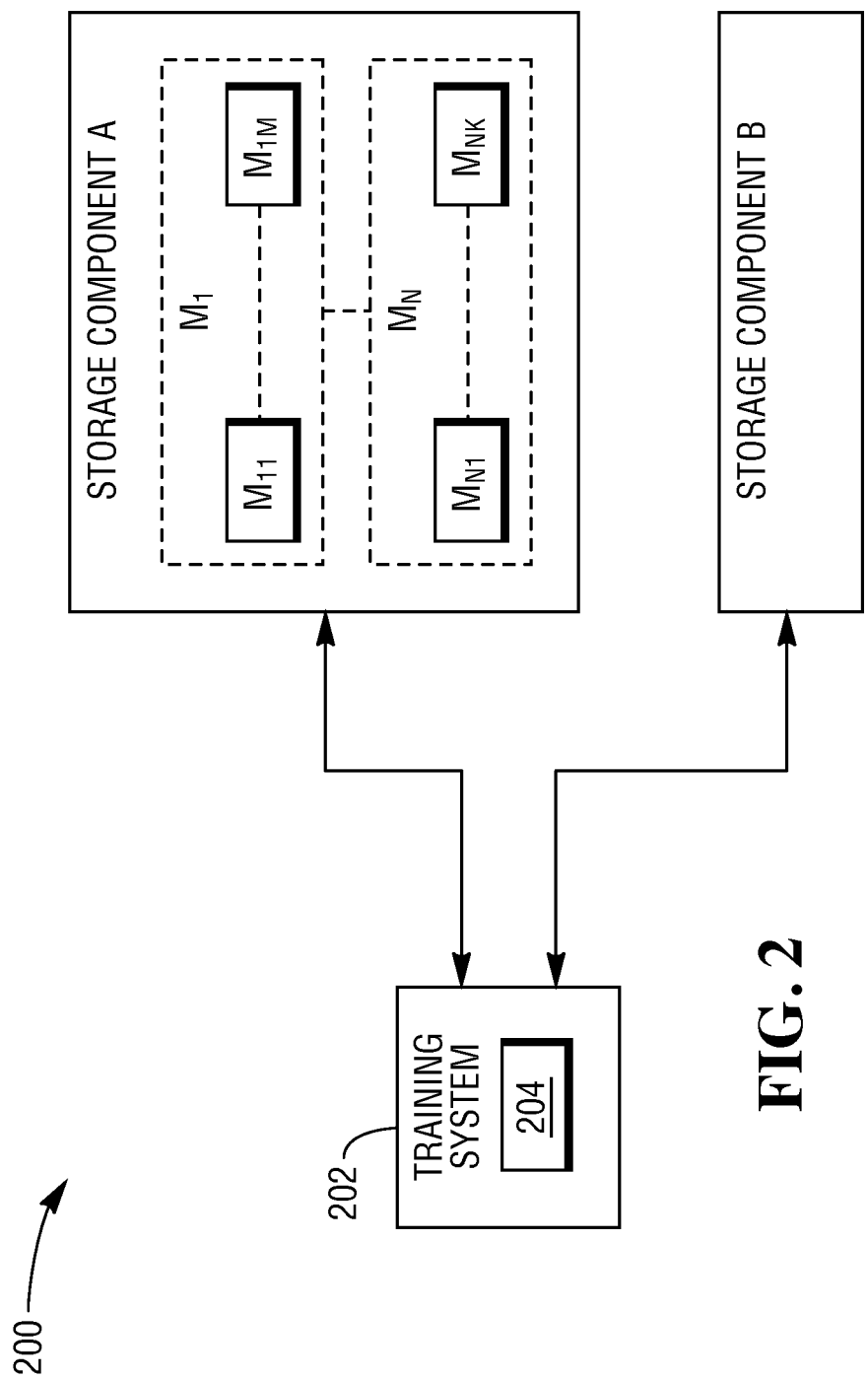
FIG. 2 depicts a training system (or training interface component) 202 in a computing environment 200 in accordance with one embodiment.

FIG. 2 depicts a training system (or training interface component) 202 in a computing environment 200 in accordance with one embodiment. Referring to FIG. 2, the training interface system 202 can be provided at least partly as computer executable code 204 configured to facilitate training of and/or configured to train at least one of the storage modules M1-MN of a first storage component A. The storage modules M1-MN can be arranged in an organization (e.g., a Rank). Each one the storage modules M1-MN can include multiple sub-modules (e.g., sub-modules M11-M1M of the storage module M1). The first storage component A can, for example, be a memory component 100 (shown in FIG. 1).

It will be appreciated that the computer executable code 204 of the training interface system 202 can facilitate training and/or can train one or more of the modules M1-MN of a first storage component A. This can be achieved by performing and/or facilitating reads and/or write requests to one or more of the sub-modules of the first storage component A (e.g., M11-M1M).

As will be described in greater detail, the training interface system 202 can include a logical interface as well as a physical interface. The training interface system 202 can also be configured to perform calibration by sampling, to capture acceptable calibration control sets based on the sampling, and use the acceptable calibration control sets as heuristics. Furthermore, the training interface system 202 can also be configured to perform one or more post-calibration activities. The training interface system 202 can also be configured to interface with an external component (e.g., external remote agent) configured to perform tuning, to affect calibration and to recording optimal settings, as well as other activities associated with training the storage component A.

Still further, the training interface system 202 can facilitate training of multiple storage components A and B. The training can be performed at the same time or in parallel, for example, by a parallel software (SW) control of calibration across all of the memory channels of a computing system or environment. The training can, for example, also include software (SW) control (or control by software) of Hardware (HW) primitives for random data pattern generation. The training interface system 202 can also allow stable interactions and can provide synchronization and control to an external agent that can be operable on a different temporal scale. The temporal scale concept can incorporate several orders of magnitude, including, for example, one or more differences between each computer executable code operation and each operation or step in the calibration process, and additional latency of messaging between the logical interface and an external component.

Figure 3:
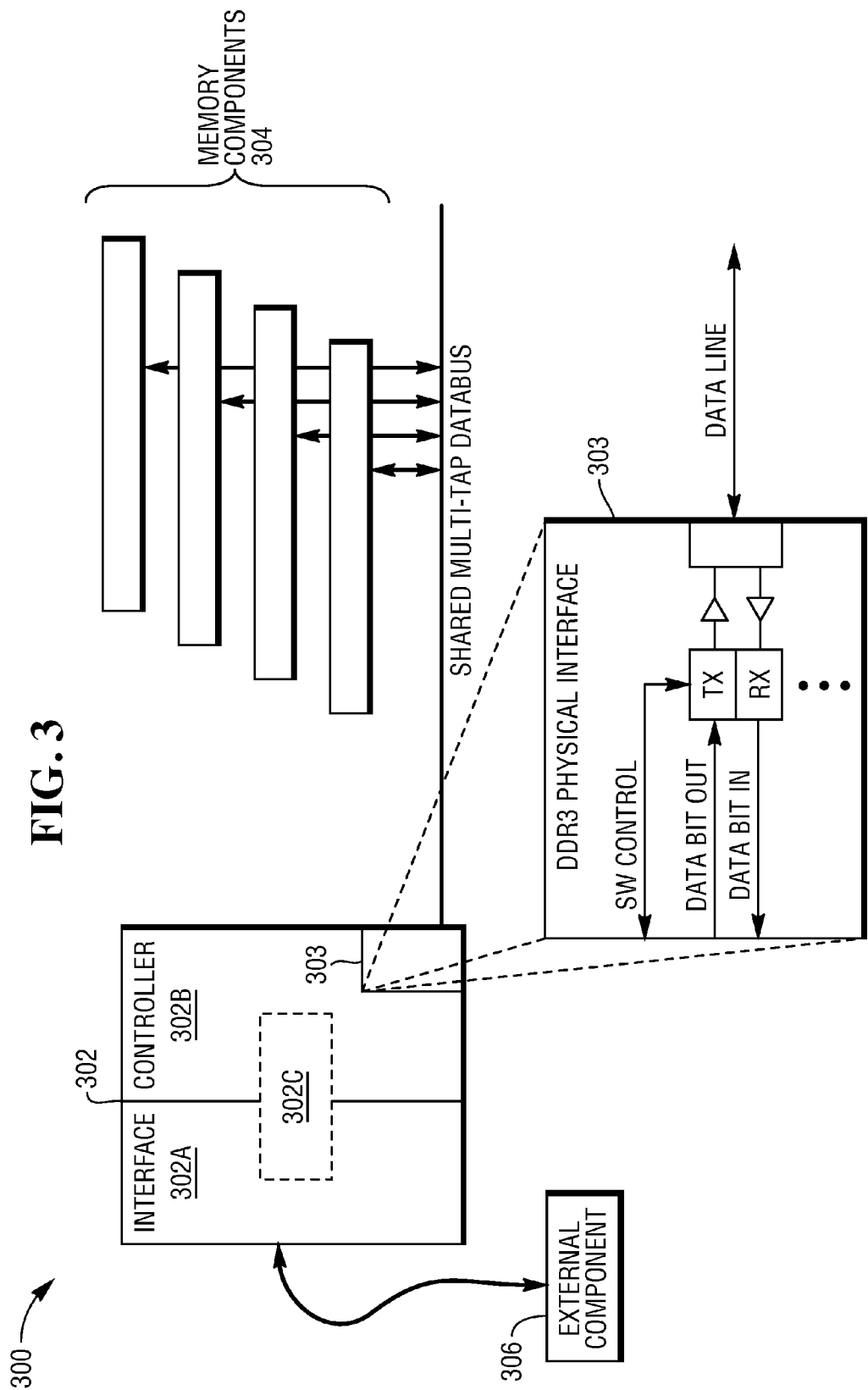
FIG. 3 depicts a memory training interface system 302 in a computing environment 300 in accordance with one embodiment.

To further elaborate, FIG. 3 depicts a memory training interface system 302 in a computing environment 300 in accordance with one embodiment. Referring to FIG. 3, the memory training interface system 302 includes an interface 302A (typically provided by SW) to a memory controller 302 (typically provided as hardware) configured to control multiple memory components 304 (e.g., DDR3 DIMMs) configured on a Shared Multi-Tap databus and each individually addressable. In addition, the memory controller 302 can include a physical interface 303 with a transmission (TX) and a Receiver (RX) for transmission and reception of data to and from the memory components 304, on a dataline, for example, on a per-bit Bidirectional Data Line. In effect, a logical interface 302C can be provided by the interface 302A and the memory controller 302B for accessing the memory components 304. An external component 306 (e.g., a remote software agent operating on a remote external computer) can use the logical interface 302C of the memory training interface system 302 for training the memory components 304.

Memory Arrangement

For example, the memory components 304 can be Multiple DIMMs (e.g., 4 DIMMs) on a multi-tap (shared) databus comprising of a memory channel. Each DIMM can be comprised of multiple "Ranks" of DDR3 DRAM, wherein each Rank independently addressable (as if it is its own DIMM). Each Rank of DRAM can be comprised of parallel DDR3 DRAM parts, row and column addressable in a conventional DDR fashion (as described in the DDR DRAM specification generally available. Each channel (databus and control) can be managed by the controller 302.

Controller

The controller 302 can effectively provide as Logical interface 302b, serve internal client read and write requests, availing clients of an entire memory (e.g., DRAM) space as a memory resource. In addition, the controller 302 can Schedule read, write, and management accesses to each memory organization (e.g., rank) on some granularity (e.g. open pages per Rank) according to availability of the memory (e.g., DDR DRAM). It can also tend to reorder requests according to memory page (e.g., DRAM) page availability, and may or may not manage the order restoration.

Physical Interface

The physical interface 303 can, for example, be comprised of bidirectional data bit interfaces for communicating with each data bitline of the multi-tap databus. By convention, data can be driven source-synchronously, along with referencing strobe signals as, for example, described by the DDR specification). Each direction of bidirectional data bit interface can include a specialized RX receiver and TX transmitter logic providing an interface controllable by the External component 306. Each RX and TX can include specialized logic allowing tuning in the time (and possibly frequency) domain, controlling signal sampling, and driving of data bitline, respectively (instead of every bit, could also be on a coarser bit group boundaries to preserve HW resources). Calibration that may be critical in ensuring that the Controller 302B drives data reliably to and receives data from every memory component on the shared data bus (every bit line).

External Component

As an example, the external component 306 can include SW running on a remote system (could also be localized SW or HW implementation). The SW can be configured to tune each RX/TX bitline to calibrate (e.g., each rank of DDR3) (or configured for a necessary granularity for an adequate signaling resolution). It can also affect calibration, for example, by writing and reading special data patterns, while adjusting RX/TX until data patterns write and read correctly, and record optimal settings in Controller-accessible Calibration Table (not shown) for post-calibration.

Calibration

As a part of training of the memory components, calibration can be performed in multiple phases, including but not limited to, for example, the following. (i) Command(s), (ii) Write leveling, and (iii) Read leveling. This can include, Write leveling (adjusting TXs until all writes to all DRAMs are effective), adjusting the output delays of DQ/DQS groups with respect to CLK. This can also include Read leveling (adjusting RXs until read data is received properly from all DRAMs), adjusting the input delays of DQ, Capturing clock to center the eye position each nibble. Random data can be used to improve the calibration quality. Data calibration can be done across multiple memory organizations (e.g., ranks with in a DIMM) where multiple memory components (e.g., DIMMs) are controlled by multiple control sets.

Generally, calibration can be driven methodically, for example, by an external component 306 (e.g., an external Agent running on a remote machine) until convergence on acceptable RX/TX settings, intentionally, calibration may not be optimized for high-speed in order to save hardware resources and provide more flexibility). SW can manage the built-in primitives to enable the calibration process. Multiple iterations can be done to select one or more optimum control sets.

For read calibration, it is possible to have multiple valid eyes or ill-formed eyes in the calibration space. The calibration algorithm can evaluate the best calibration points, for example, first by shifting DQ delays to enlarge the read capture eye into the available clock-shifting window then by selecting the largest eye and center the capture clock in the eye as the optimum sample points. This can make multidimensional searching more tractable. A clock centering scheme can be the enabler of PVT (process, voltage, temperature) compensation where due to process differences, voltage and temperature may change during the DRAM normal operation. The capture clock can track the incoming strobe signals, for example, from one or more DRAM chips to adjust the clock phase matching the strobe signal phase. Optimal settings from the algorithm can provide enough slack for reliable memory (e.g., DRAM) operations in the entire voltage and temperature variation ranges. It can also compensate for the manufacturing process variations for the IOs.

Fast calibration can be achieved, for example, by sampling and capturing "good" calibration control sets and using them as calibration heuristics. As a software-based scheme, this can, for example, reduce the system DDR3 calibration time from about 15 minutes to about 40 sec.

Memory controls (e.g. a DIMM on-board control) can be programmed to match its associated controller, topology and/or access patterns.

Dynamic ODT control for both memory controller and the on-memory (e.g., on-DIMM) buffers can be provided. Selecting the proper ODT control can minimize the overall system power consumption and can allow more scalability. As a result, more memory channels and/or more memory capacity can be supported.

Post-Calibration, Steady-State Operation

Memory controller 302B can consult a Calibration Table to auto-adjust RX and TX prior to accessing a particular rank of DRAMs. In addition, the Memory controller 302B may monitor and make intermittent adjustments, for example, due to thermal changes, in order to maintain the signaling. It should be noted that the external component 306 may intermittently recalibrate or otherwise monitor for necessary adjustments.

Calibration Complexity

As an example, a DIMM can have multiple ranks. A rank can have multiple chips arranged in parallel. They can be reflected as multiple nibbles on the memory bus in a memory channel. In this case, it is desirable for Memory calibration to be done with respect to individual nibbles (the chips in each rank). In accordance with one embodiment, control sets can be mapped to each individual DIMM (e.g., 4 DIMMs). For example, for 4 DIMMS, a calibration algorithm can produce four (4) read control sets and four (4)) write control sets. For each DIMM, the calibration algorithm can run through multiple address sample points to every rank. The largest overlapping eyes and the center point across all ranks for each nibble can be selected as the final calibration points. For example, an FPGA based IO can have a fixed tap-delay mechanism that needs to cover wide-rang of IOs. There can be a trade-off between the total delay coverage over the DRAM clock cycle and the resolution of the delays. The higher the delay resolution, the smaller the cycle coverage. If the delay cannot cover the entire cycle, the discontinuity can give an ill-formed eye. Lower delay resolutions can lead to lower calibration capacities.

Hardware Primitives to Facilitate the SW Controlled Calibration

BIST (Built-In Self Test) like random data generation can, for example, be used to generate large amount data for memory testing and self-checking. This can give relatively fast feedbacks on different calibration settings. Control registers and state-machines can be used to control the calibration flow, for example, based on DDR3 required ZQ calibration, bank precharge operations, memory test random data, and/or address generation controls.

Figure 4:
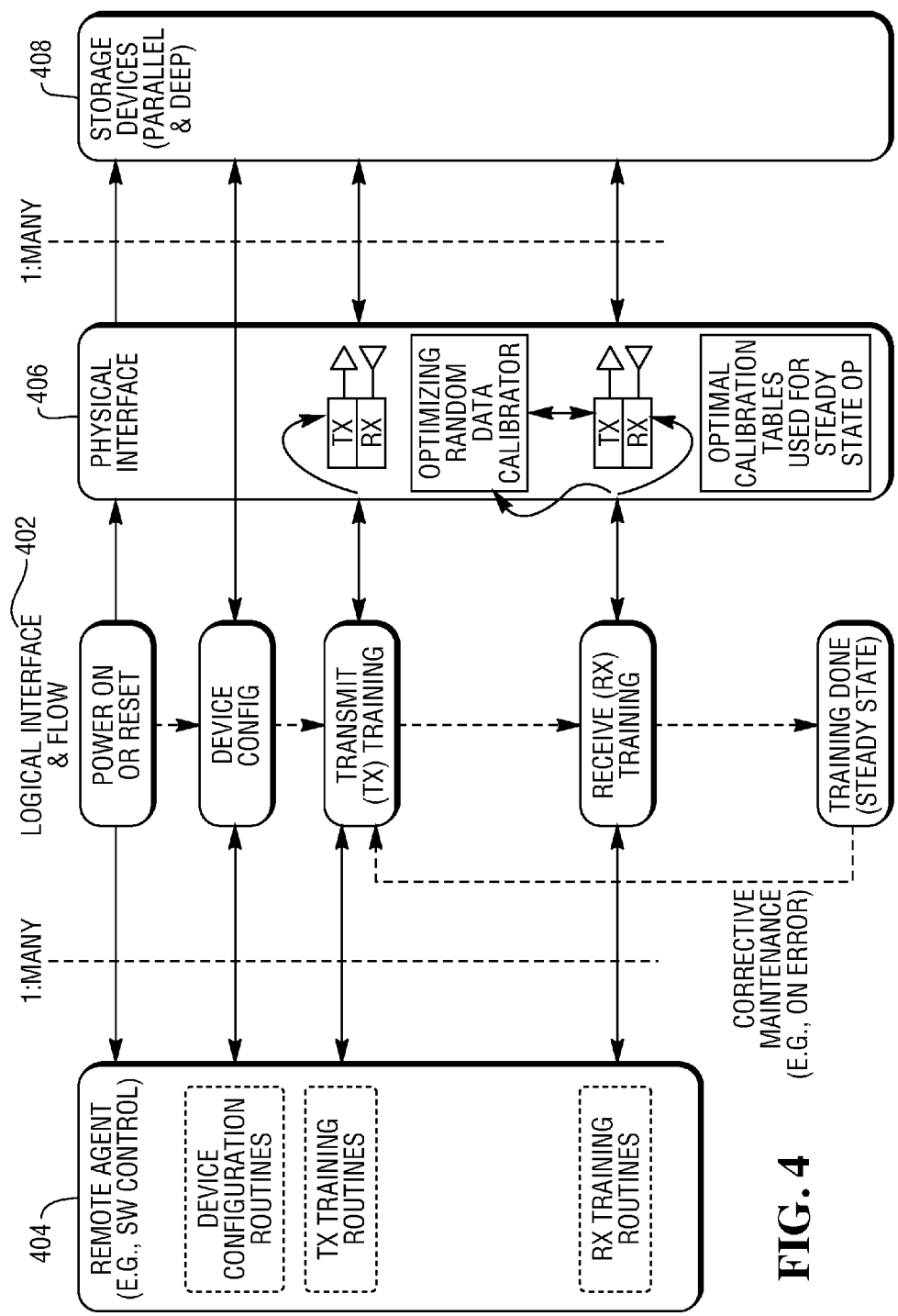
FIG. 4 depicts a logical interface 402 and flow between a remote agent 404, physical interface 406 and storage devices 408 in accordance with one embodiment.

To elaborate even further, FIG. 4 depicts a logical interface 402 and flow between a remote agent 404, physical interface 406 and storage devices 408 in accordance with one embodiment. Referring to FIG. 4, after a power on or reset, device configuration routines can be initiated to configure the storages devices 408 that can be arranged in a parallel and/or deep configuration. Next, TX training routines can be initiated using the physical interface. Thereafter, RX training routines and an optimizing random data calibrator can be used and corrective maintenance can be provided as feedback. An exit from a steady state (training done), involving retraining and fixing issues detected over time, can take place. This can form a loop with Training Done (steady-state) being the primary goal and the corrective maintenance being triggered on periodic error conditions to fix an ailing link for the purpose of returning it to the reliable steady state.

An Example of Transmit (TX) Training

Figure 5:
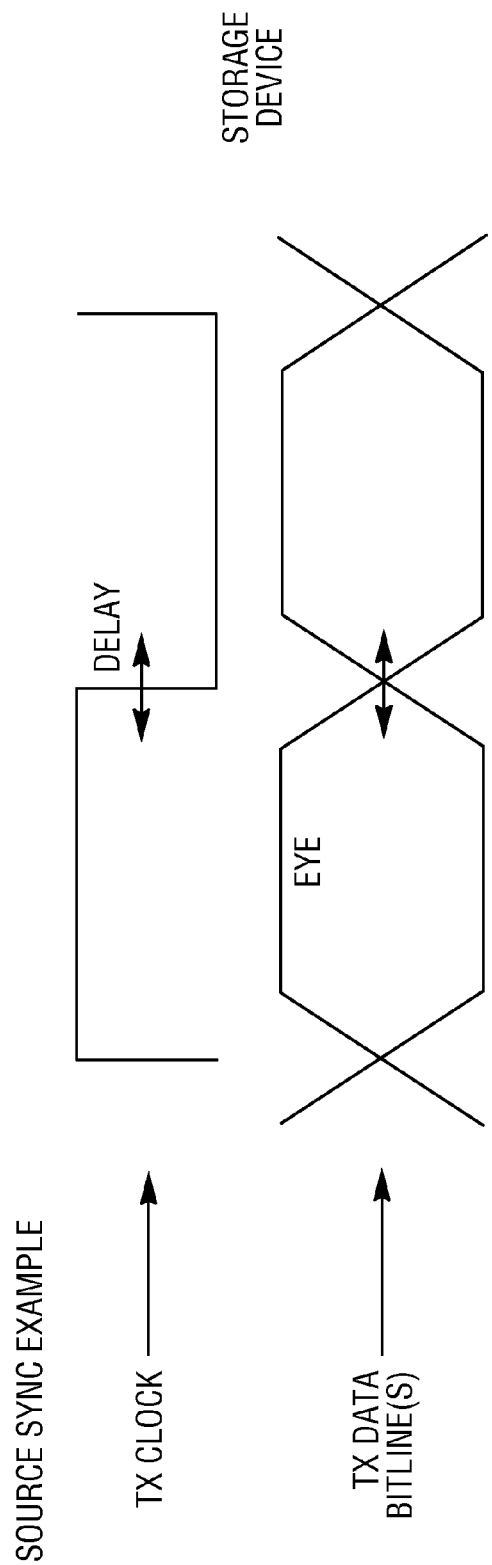
FIG. 5 depicts a source synchronization (sync) example in accordance with one embodiment.

FIG. 5 depicts a source synchronization (sync) example in accordance with one embodiment. It should be noted that Physical interface controls can, for example, include TX_DATA_DELAY, TX_CLOCK_DELAY, and TX_PHASE_SHIFT. Physical interface controls can also Govern physical-level transmit parameters for one or more bitlines, or groups thereof. Also, Feedback can be provided by RX & TX status and data. Logical routines (Remote agent utilizing physical interface controls and status) can, for example, include Write_Eye_Id—Potential eye qualification, Write_Eye_Sel—Determine optimal eye, and Write_Calib_Set—Calibrate to center of the eye.

An Example of Receive (RX) Training

Physical interface controls can, for example, include RX_DATA_DELAY, RX_CLOCK_DELAY, RX_PHASE_SHIFT, and RX_CMD_SYNC_BUF_DELAY. Optimizing Random Data Calibrator can include Random_Write, Random_Read, Data_Check. Physical-level receive parameters can be governed for one or more bitlines, or groups thereof. This can include internal deskew buffers (not shown) at various multi-bit granularities. Feedback can be provided by RX & TX status and data. Logical routines (Remote agent utilizing physical interface controls and status) can, for example, include, Read_Eye_Id—Potential eye qualification, Read_Eye_Sel—Determine optimal eye, and Read_Calib_Set—Calibrate to center of the eye.

In view of the foregoing, it will readily be appreciated that training of storage devices can establishing coherent communications with the storage devices including non-volatile memory devices over deep, parallel interfaces. The training can interface of at least one communication bitline (uni-directional or bi-directional), which may be controllable and observable in groups of one or more bitlines. Multiple devices may be attached to each bitline (e.g. multiple ranks and DIMMs) for the training. Maintenance can also be performed, for example, as a result of error occurrence due to thermals or changes of configuration, where selective training of the affected portion(s) can be performed selectively. A remote agent (SW control) can be decoupled and enabled for disparate computational speed and communication latency, to monitor and control the Training and Maintenance processes in a manner which maintains stability and progress.

One or more embodiment can provide one or more of the following:

System scale—Training of many storage (e.g., memory) devices can be accomplished via entity (e.g., remote agent in a cost effective manner, Local scale—Many storage devices may be attached to any one parallel interface (depth of rank) of arbitrary width because of precision of training capability, Storage device flexibility—an external component (e.g., a remote agent) may be implemented in SW, allowing the ability to work with many different types and dimensions of storage devices (e.g. many different types of DDR memories and dimensions) in a flexible manner, and Physical interface flexibility—a Physical interface may be implemented at various widths and using various technologies (e.g., source-synchronous, target-synchronous etc.) and the external component (e.g., remote agent) need not change the behavior or at least changes may be reduced or minimized.

By dividing the entire training process into stable points of interaction, providing an interface abstraction, and implementing such that the physical interface will operate the memory components in a necessary and admissible manner, an external component may do the majority of the analysis required to obtain an optimal result. For example, during receive training, the physical interface may be instructed by the external component to read continuously a particular memory address, each of which reads occurs over a relatively small time scale, sampling one or more results (including possible application of post-processing like averaging, etc.) for presentation to the external agent at its leisure (operating, e.g., 10000× slower) by way of the logical interface. The external agent, upon making a determination as to quality of results, may instruct the physical interface, by way of the logical interface abstraction, to adjust one or more parameters pertinent to receiving data and then to collect more samples.

The physical interface all the while can follow required procedures to maintain the stability of the memory components and their contents up to that phase of training, thus ensuring forward progress. An example with respect to DDR memory is that the physical interface would continue applying appropriate refresh cycles (very many could be required due to time lag) to maintain internal data contents necessary for training. Similarly, the physical interface may close open pages, monitor temperature, adjust voltages, etc., to ensure no loss of data.

In one embodiment, the physical interface may send an interrupt to the external agent when it has determined enough samples have been acquired, particularly useful if the external agent is managing many such interfaces and benefits from operating through an interrupt model; or it may act as simply a slave device, being instructed and polled periodically for results. One benefit of decoupling in this manner is that the computer executable code may be invariant to changes in memory device technology—only the physical interface would need to change. Similarly, the memory device type can be invariant to changes in the remote agent overall character: architecture, communication latency, spatial configuration, etc.

It should also be noted that the techniques described above can be combined with the use of sub-channels, for example, as described in U.S. patent application Ser. No. 13/970,721, entitled: "DESIGNATED MEMORY SUB-CHANNEL FOR COMPUTING SYSTEMS AND ENVIRONMENTS," which is hereby incorporated by reference herein.

Generally, various aspects, features, embodiments or implementations of the invention described above can be used alone or in various combinations. Furthermore, implementations of the subject matter and the functional operations described in this specification can be implemented in digital electronic circuitry, or in computer software, firmware, or hardware, including the structures disclosed in this specification and their structural equivalents, or in combinations of one or more of them. Implementations of the subject matter described in this specification can be implemented as one or more computer program products, i.e., one or more modules of computer program instructions encoded on a computer readable medium for execution by, or to control the operation of, data processing apparatus. The computer readable medium can be a machine-readable storage device, a machine-readable storage substrate, a memory device, a composition of matter affecting a machine-readable propagated signal, or a combination of one or more of them. The term "data processing apparatus" encompasses all apparatus, devices, and machines for processing data, including by way of example a programmable processor, a computer, or multiple processors or computers. The apparatus can include, in addition to hardware, code that creates an execution environment for the computer program in question, e.g., code that constitutes processor firmware, a protocol stack, a database management system, an operating system, or a combination of one or more of them. A propagated signal is an artificially generated signal, e.g., a machine-generated electrical, optical, or electromagnetic signal that is generated to encode information for transmission to suitable receiver apparatus.

A computer program (also known as a program, software, software application, script, or code) can be written in any form of programming language, including compiled or interpreted languages, and it can be deployed in any form, including as a standalone program or as a module, component, subroutine, or other unit suitable for use in a computing environment. A computer program does not necessarily correspond to a file in a file system. A program can be stored in a portion of a file that holds other programs or data (e.g., one or more scripts stored in a markup language document), in a single file dedicated to the program in question, or in multiple coordinated files (e.g., files that store one or more modules, subprograms, or portions of code). A computer program can be deployed to be executed on one computer or on multiple computers that are located at one site or distributed across multiple sites and interconnected by a communication network.

The processes and logic flows described in this specification can be performed by one or more programmable processors executing one or more computer programs to perform functions by operating on input data and generating output. The processes and logic flows can also be performed by, an apparatus can also be implemented as, special purpose logic circuitry, e.g., an FPGA (field programmable gate array) or an ASIC (application specific integrated circuit).

Processors suitable for the execution of a computer program include, by way of example, both general and special purpose microprocessors, and any one or more processors of any kind of digital computer. Generally, a processor will receive instructions and data from a read only memory or a random access memory or both. The essential elements of a computer are a processor for performing instructions and one or more memory devices for storing instructions and data. Generally, a computer will also include, or be operatively coupled to receive data from or transfer data to, or both, one or more mass storage devices for storing data, e.g., magnetic, magneto-optical disks, or optical disks. However, a computer need not have such devices. Moreover, a computer can be embedded in another device, e.g., a mobile telephone, a personal digital assistant (PDA), a mobile audio player, a Global Positioning System (GPS) receiver, to name just a few. Computer readable media suitable for storing computer program instructions and data include all forms of nonvolatile memory, media and memory devices, including by way of example semiconductor memory devices, e.g., EPROM, EEPROM, and flash memory devices; magnetic disks, e.g., internal hard disks or removable disks; magneto optical disks; and CDROM and DVD-ROM disks. The processor and the memory can be supplemented by, or incorporated in, special purpose logic circuitry.

To provide for interaction with a user, implementations of the subject matter described in this specification can be implemented on a computer having a display device, e.g., a CRT (cathode ray tube) or LCD (liquid crystal display) monitor, for displaying information to the user and a keyboard and a pointing device, e.g., a mouse or a trackball, by which the user can provide input to the computer. Other kinds of devices can be used to provide for interaction with a user as well; for example, feedback provided to the user can be any form of sensory feedback, e.g., visual feedback, auditory feedback, or tactile feedback; and input from the user can be received in any form, including acoustic, speech, tactile or near-tactile input.

Implementations of the subject matter described in this specification can be implemented in a computing system that includes a backend component, e.g., as a data server, or that includes a middleware component, e.g., an application server, or that includes a frontend component, e.g., a client computer having a graphical user interface or a Web browser through which a user can interact with an implementation of the subject matter described is this specification, or any combination of one or more such backend, middleware, or frontend components. The components of the system can be interconnected by any form or medium of digital data communication, e.g., a communication network. Examples of communication networks include a local area network ("LAN") and a wide area network ("WAN"), e.g., the Internet.

The computing system can include clients and servers. A client and server are generally remote from each other and typically interact through a communication network. The relationship of client and server arises by virtue of computer programs running on the respective computers and having a client-server relationship to each other.

While this specification contains many specifics, these should not be construed as limitations on the scope of the disclosure or of what may be claimed, but rather as descriptions of features specific to particular implementations of the disclosure. Certain features that are described in this specification in the context of separate implementations can also be implemented in combination in a single implementation. Conversely, various features that are described in the context of a single implementation can also be implemented in multiple implementations separately or in any suitable sub-combination. Moreover, although features may be described above as acting in certain combinations and even initially claimed as such, one or more features from a claimed combination can in some cases be excised from the combination, and the claimed combination may be directed to a sub-combination or variation of a sub-combination.

Similarly, while operations are depicted in the drawings in a particular order, this should not be understood as requiring that such operations be performed in the particular order shown or in sequential order, or that all illustrated operations be performed, to achieve desirable results. In certain circumstances, multitasking and parallel processing may be advantageous. Moreover, the separation of various system components in the implementations described above should not be understood as requiring such separation in all implementations, and it should be understood that the described program components and systems can generally be integrated together in a single software product or packaged into multiple software products.

The various aspects, features, embodiments or implementations of the invention described above can be used alone or in various combinations. The many features and advantages of the present invention are apparent from the written description and, thus, it is intended by the appended claims to cover all such features and advantages of the invention. Further, since numerous modifications and changes will readily occur to those skilled in the art, the invention should not be limited to the exact construction and operation as illustrated and described. Hence, all suitable modifications and equivalents may be resorted to as falling within the scope of the invention.

What is claimed is:

1. A method for training storage components that each includes storage modules, wherein each of the storage modules includes multiple storage sub-modules that are individually addressable, wherein the method is performed at least partly by a device, and wherein the method comprises:
    providing an interfacing component at least partly as computer executable code configured to train one or more storage modules of a first storage component of the storage components at least partly by:
    facilitating and/or performing read and/or write requests to one or more storage sub-modules of at least one of the modules of the first storage component, wherein each of the one or more storage modules includes multiple storage sub-modules that are individually addressable, and wherein the facilitating and/or performing read and/or write requests to the one or more storage sub-modules of the at least one of the modules of the first storage component individually addresses the one or more sub-modules.

2. The method of claim 1, wherein the interfacing component is further configured to facilitate training of one or more storage modules of a second storage component at least partly by:
    facilitating read and/or write requests to one or more of storage sub-modules of the one or more storage modules of the second storage component.

3. The method of claim 1, wherein the computer executable code is further configured to train storage modules of the first storage component at least partly by generating random data patterns.

4. The method of claim 1, wherein the interfacing component ncludes a logical interface and a physical interface.

5. The method of claim 4, wherein the logical interface is configured to perform one or more of the following: schedule reads, schedule writes, and management accesses to the one or more of the storage sub-modules of the one or more storage modules of the first storage component.

6. The method of claim 4, wherein the physical interface is configured to allow tuning of the one or more of the storage sub-modules of the one or more storage modules of the first storage component in the time and/or frequency domains.

7. The method of claim 4, wherein the logical interface is configured to interface with an external component.

8. The method of claim 7, wherein the external component is a remote agent configured to perform one or more of the following: tuning, affecting calibration and recording of optimal settings associated with the training of the one or more of the storage sub-modules of the one or more storage modules of the first storage component.

9. The method of claim 1, wherein the computer executable code is further configured to allow stable interactions and can provide synchronization and control to an external agent that can be operable on a different temporal scale.

10. The method of claim 1, wherein interfacing component is further configured to perform one or more of the following: perform calibration by sampling, capture acceptable calibration control sets based on the sampling and use one or more acceptable calibration control sets as heuristics.

11. The method of claim 1, wherein the interfacing component is further configured to perform one or more post-calibration activities.

12. The method of claim 1, wherein the first storage component includes DDR-based memory.

13. The method of claim 12, wherein the first storage component includes one four (4) DIMMs of DDR3 configured on a single channel.

14. The method of claim 12, wherein the first storage component includes one four (4) DIMMs of DDR4 configured on a single channel.

15. A device that includes one or more processors configured to train storage components that each includes storage modules arranged in one or more channels, wherein each of the storage modules includes multiple storage sub-modules that are individually addressable, wherein the one or more processors are further configured to:
provide an interface component at least partly as computer executable code configured to train one or more storage modules of a first storage component of the storage components at least partly by:
facilitate and/or perform read and/or write requests to one or more storage sub-modules of at least one storage module of the first storage component.

16. A non-transitory computer readable storage medium for training storage components that each includes storage modules arranged in one or more channels, wherein each of the storage modules includes multiple storage sub-modules that are individually addressable, wherein the computer readable storage medium when executed:
provides an interfacing component at least partly as computer executable code configured to train one or more storage modules of a first storage component of the storage components at least partly by:
facilitate and/or performing read and/or write requests to one or more storage sub-modules of at least one storage module of the first storage component.

* * * * *